US011951836B2

(12) United States Patent
Kang et al.

(10) Patent No.: US 11,951,836 B2
(45) Date of Patent: Apr. 9, 2024

(54) VEHICLE INSTRUMENT PANEL (71) Applicant: LG Electronics Inc., Seoul (KR)

(72) Inventors: Kyungpil Kang, Seoul (KR); Yongjoon Sohn, Seoul (KR)

(73) Assignee: LG Electronics Inc., Seoul (KR)

(*) Notice: Subject to any disclaimer, the term of this patent is extended or adjusted under 35 U.S.C. 154(b) by 299 days.

(21) Appl. No.: 16/757,688

(22) PCT Filed: Mar. 23, 2018

(86) PCT No.: PCT/KR2018/003434
§ 371 (c)(1),
(2) Date: Apr. 20, 2020

(87) PCT Pub. No.: WO2019/093594
PCT Pub. Date: May 16, 2019

(65) Prior Publication Data
US 2020/0269698 A1 Aug. 27, 2020

(30) Foreign Application Priority Data
Nov. 8, 2017 (KR) .......................... 10-2017-0148036

(51) Int. Cl.
B60K 37/02 (2006.01)
G02F 1/1333 (2006.01)

(52) U.S. Cl.
CPC ........ B60K 37/02 (2013.01); G02F 1/133305 (2013.01); B60K 2370/152 (2019.05); B60K 2370/688 (2019.05); B60K 2370/692 (2019.05)

(58) Field of Classification Search
None
See application file for complete search history.

(56) References Cited

U.S. PATENT DOCUMENTS

| 5,623,392 | A * | 4/1997 | Ma | G02F 1/133308 |
| | | | | 345/905 |
| 2010/0201816 | A1* | 8/2010 | Lee | B60R 1/12 |
| | | | | 349/1 |
| 2014/0146269 | A1* | 5/2014 | Kim | G02B 6/0093 |
| | | | | 445/24 |
| 2014/0210605 | A1* | 7/2014 | Abel | B60K 37/02 |
| | | | | 340/441 |
| 2016/0011021 | A1* | 1/2016 | Masuda | G01D 13/28 |
| | | | | 116/288 |
| 2016/0221440 | A1* | 8/2016 | Tane | G01D 11/28 |

(Continued)

FOREIGN PATENT DOCUMENTS

FR 3003963 10/2014
JP 2012113672 6/2012

(Continued)

OTHER PUBLICATIONS

EP Extended European Search Report in European Appln. No. 18875787.6, dated Jun. 25, 2021, 8 pages.

Primary Examiner — Christopher R Lamb
(74) Attorney, Agent, or Firm — Fish & Richardson P.C.

(57) ABSTRACT

The present disclosure relates to a vehicle instrument panel, including: a plurality of displays; a cover glass covering the plurality of displays; and a first frame of a metal material that supports the plurality of displays by being press-fitted to the cover glass with the plurality of displays interposed therebetween.

25 Claims, 8 Drawing Sheets (56) References Cited

U.S. PATENT DOCUMENTS

2016/0368379 A1* 12/2016 Larry ................ G02F 1/133308
2018/0188870 A1*  7/2018 Boggs ................ G02F 1/13338
2019/0343009 A1* 11/2019 Kim ..................... H05K 5/0021

FOREIGN PATENT DOCUMENTS

| JP | 5962719 | 8/2016 |
| KR | 100937630 | 1/2010 |
| KR | 20130067108 | 6/2013 |
| KR | 20130123275 | 11/2013 |
| KR | 101337305 | 12/2013 |
| KR | 101374118 | 3/2014 |
| KR | 20160008307 | 1/2016 |
| KR | 20170004068 | 1/2017 |

* cited by examiner

Section d-d

VEHICLE INSTRUMENT PANEL

CROSS-REFERENCE TO RELATED APPLICATIONS

This application is a National Stage application under 35 U.S.C. § 371 of International Application No. PCT/KR2018/003434, filed on Mar. 23, 2018, which claims the benefit of earlier filing date and right of priority to Korean Application No. 10-2017-0148036, filed on Nov. 8, 2017. The disclosures of the prior applications are incorporated by reference in their entirety.

BACKGROUND OF THE INVENTION

1. Field of the Invention

The present invention relates to an instrument panel for a vehicle.

2. Description of the Related Art

A vehicle is an apparatus that moves in a direction desired by a user riding therein. A representative example of a vehicle may be an automobile.

An instrument panel according to an existing technology has an exterior formed of synthetic resin, and various user interface components disposed therein.

A complex design and complicated processes are required to manufacture such an instrument panel, depending on arrangement and coupling relationships between components.

In addition, the instrument panel according to an existing technology provides only a display device composed of a single Liquid Crystal Display (LCD), without an additional display for a person sitting in a front-passenger seat.

In addition, the instrument panel according to an existing technology has a gap between components due to a complicated arrangement thereof, and therefore, the components may be crashed with one another upon an external shock and possibly damaged.

SUMMARY OF THE INVENTION

The present invention has been made in view of the above problems, and it is one object of the present invention to provide an instrument panel for a vehicle, which includes a plurality of displays and fixes the plurality of displays securely and stably.

Objects of the present invention should not be limited to the aforementioned objects and other unmentioned objects will be clearly understood by those skilled in the art from the following description.

In accordance with an embodiment of the present invention, the above and other objects can be accomplished by the provision of an instrument panel for a vehicle, including: a plurality of displays; a cover glass which covers the plurality of displays; and a first frame which is pressed and coupled to the cover glass with the plurality of displays therebetween so as to support the plurality of displays.

The details of other embodiments are included in the following description and the accompanying drawings.

The embodiments of the present invention have one or more effects as follows.

First, as a plurality of displays is provided, it is possible to provide various functions to a driver and a person sitting in a front-passenger seat.

Second, as a first frame formed of a metal material is pressed and coupled to a cover glass to thereby remove an inner gap, it is possible to minimize damage to components upon an external shock.

Third, as the plurality of displays are integrally formed, it is easy to design and manufacture an instrument panel, increasing production yields.

Fourth, due to a plurality of ribs, it is possible to efficiently manage heat generated by at least one of the plurality of displays.

Effects of the present invention should not be limited to the aforementioned effects and other unmentioned effects will be clearly understood by those skilled in the art from the claims.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Hereinafter, the embodiments disclosed in the present specification will be described in detail with reference to the accompanying drawings, and the same or similar elements are denoted by the same reference numerals even though they are depicted in different drawings and redundant descriptions thereof will be omitted. In the following description, with respect to constituent elements used in the following description, the suffixes "module" and "unit" are used or combined with each other only in consideration of ease in the preparation of the specification, and do not have or serve as different meanings. Accordingly, the suffixes "module" and "unit" may be interchanged with each other. In addition, in the following description of the embodiments disclosed in the present specification, a detailed description of known functions and configurations incorporated herein will be omitted when it may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present invention.

It will be understood that although the terms "first," "second," etc., may be used herein to describe various components, these components should not be limited by these terms. These terms are only used to distinguish one component from another component.

It will be understood that when a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise.

In the present application, it will be further understood that the terms "comprises", includes," etc. specify the presence of stated features, integers, steps, operations, elements, components, or combinations thereof, but do not preclude the presence or addition of one or more other features, integers, steps, operations, elements, components, or combinations thereof.

A vehicle as described in this specification may include an automobile and a motorcycle. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

Figure 1A:
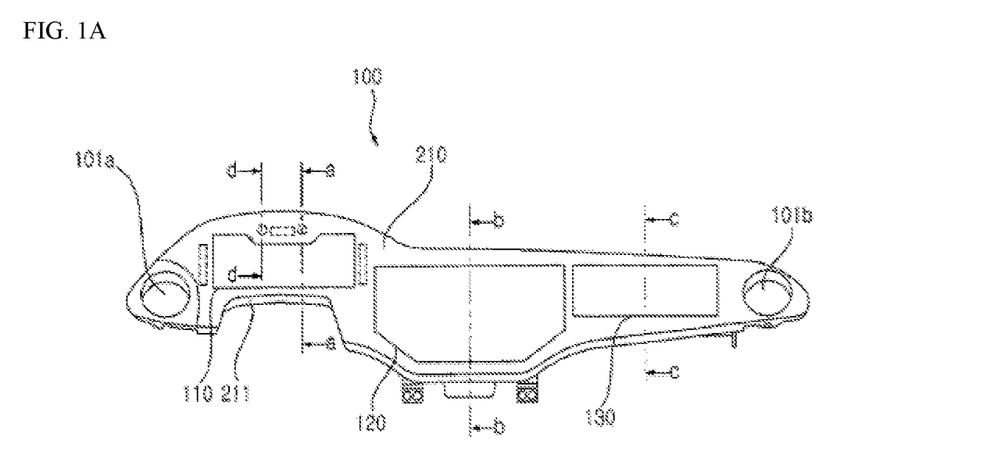
FIGS. 1A to 1C are different angled-views of an instrument panel according to an embodiment of the present invention.
Figure 1B:
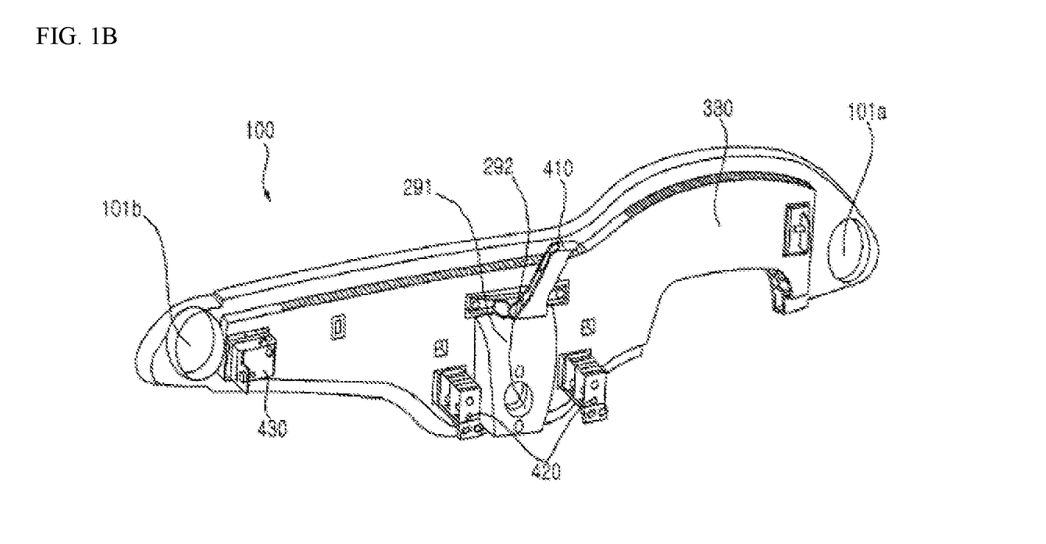
Figure 1C:
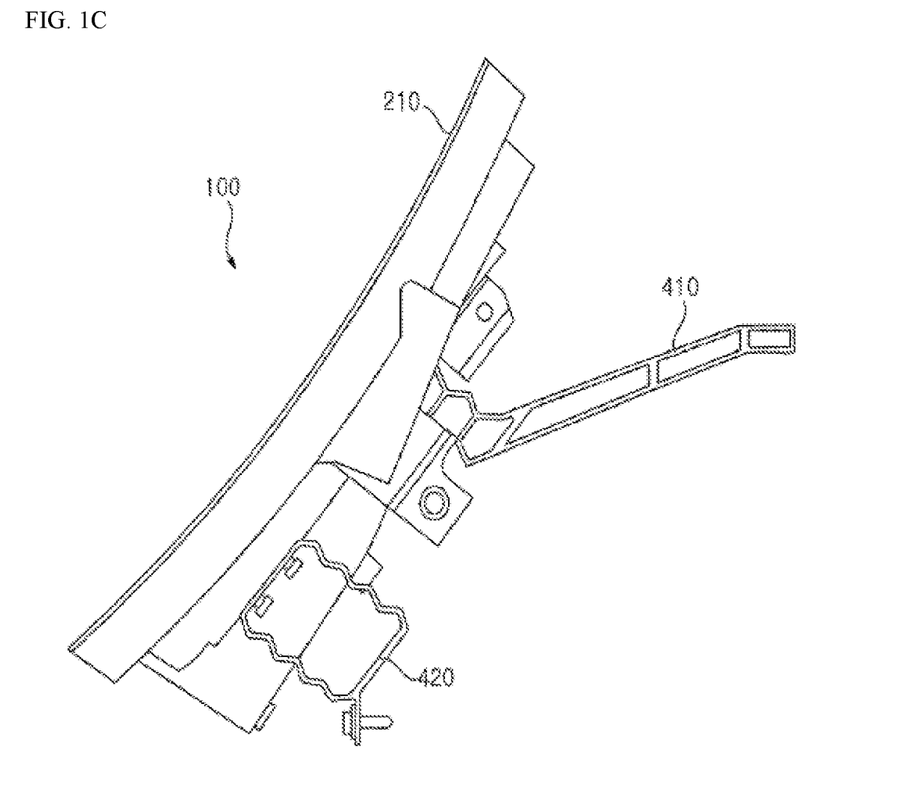

FIGS. 1A to 1C are different angled-views of an instrument panel according to an embodiment of the present invention.

Figure 2:
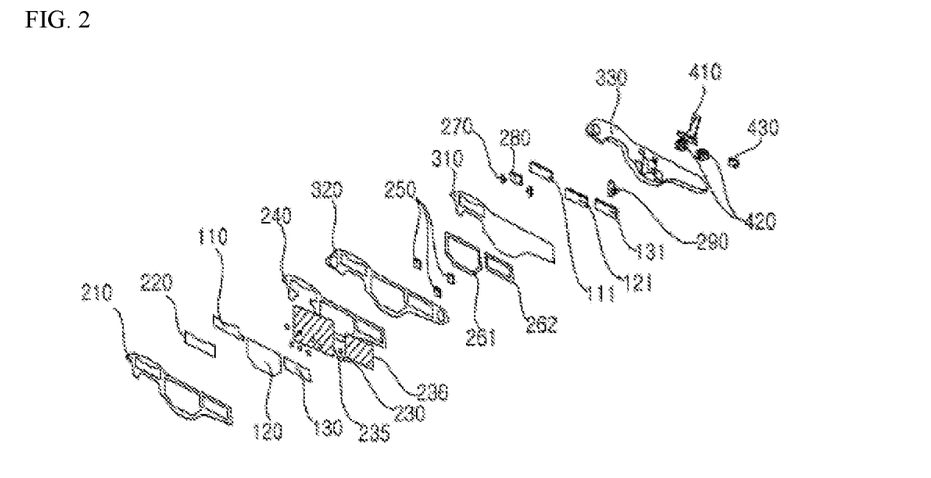
FIG. 2 is an exploded perspective view of an instrument panel according to an embodiment of the present invention.

FIG. 2 is an exploded perspective view of an instrument panel according to an embodiment of the present invention.

Figure 3:
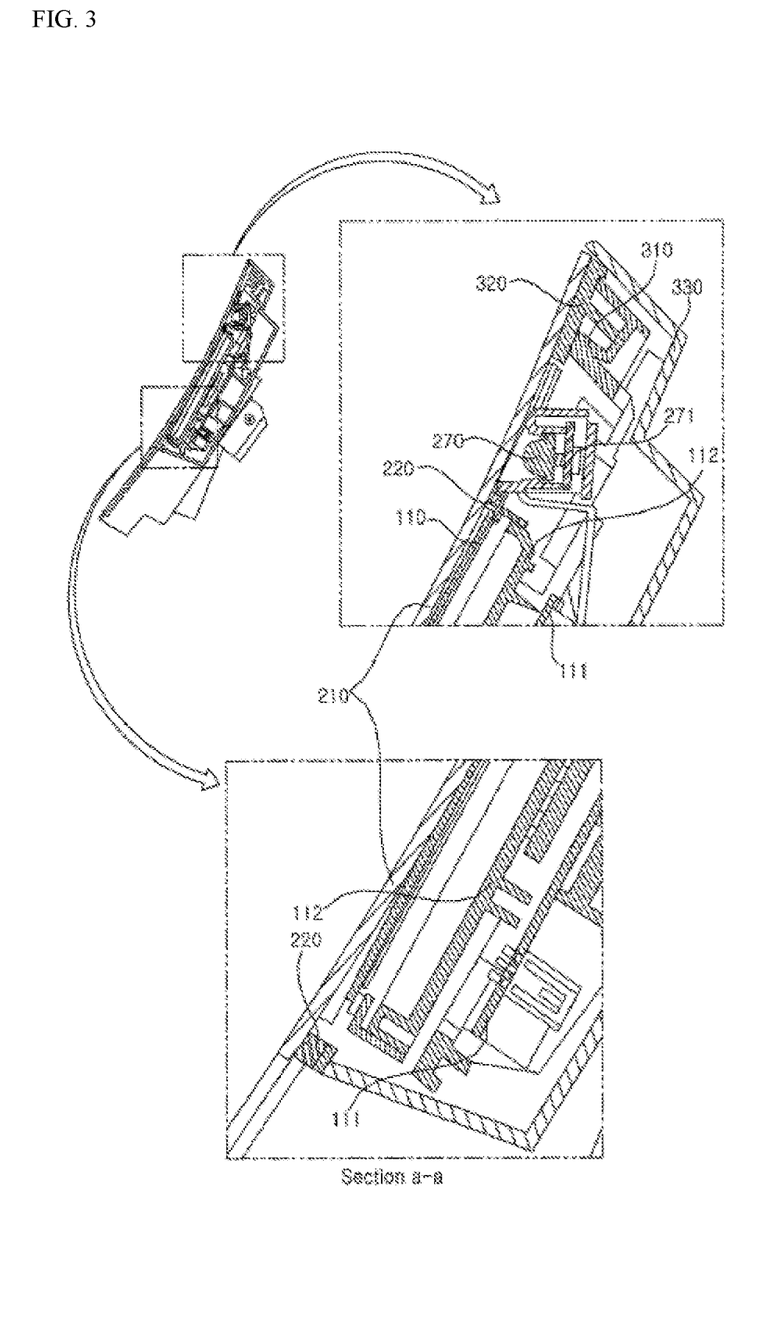
FIG. 3 is a cross-sectional view of FIG. 1A cut along line a-a.

FIG. 3 is a cross-sectional view of FIG. 1A cut along line a-a.

Figure 4:
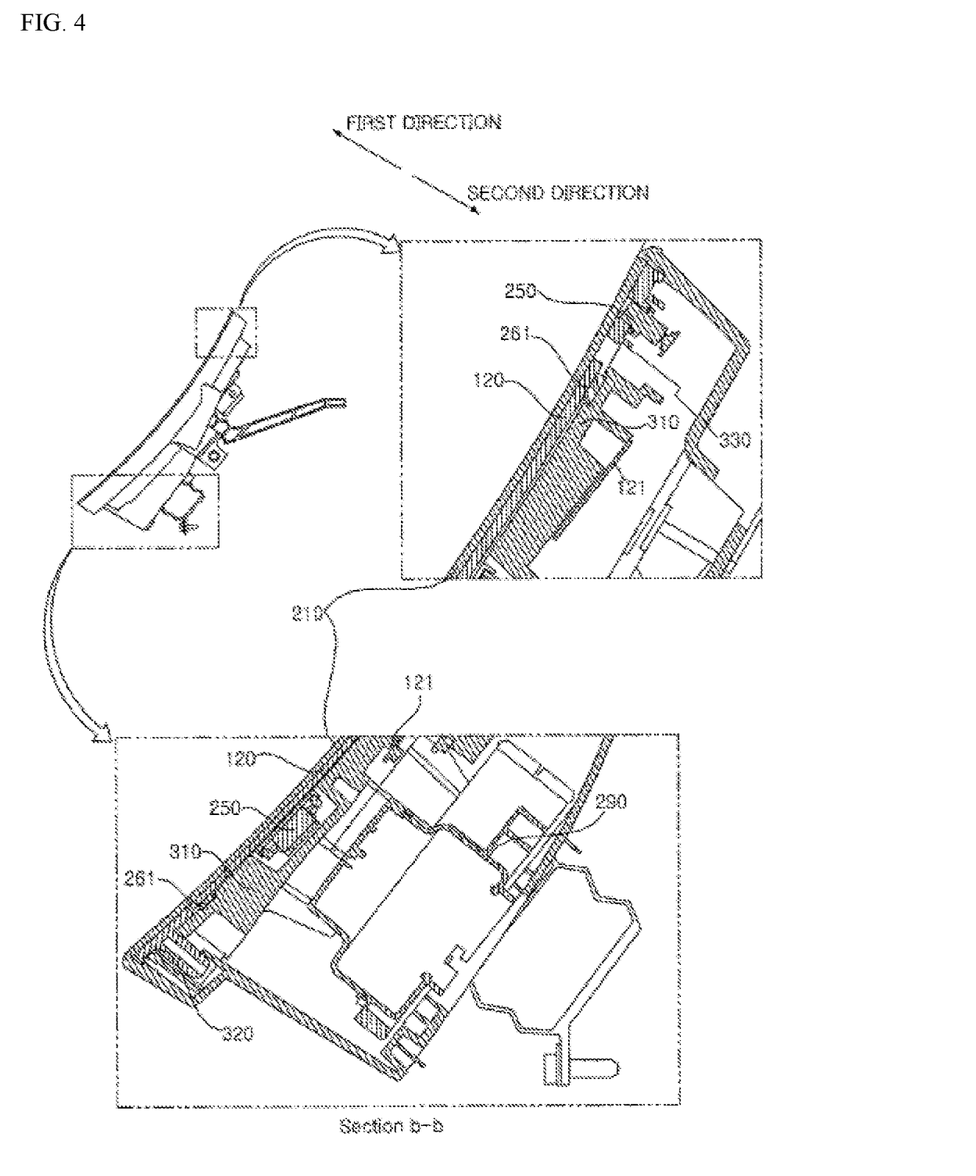
FIG. 4 is a cross-sectional view of FIG. 1A cut along line b-b.

FIG. 4 is a cross-sectional view of FIG. 1A cut along line b-b.

Figure 5:
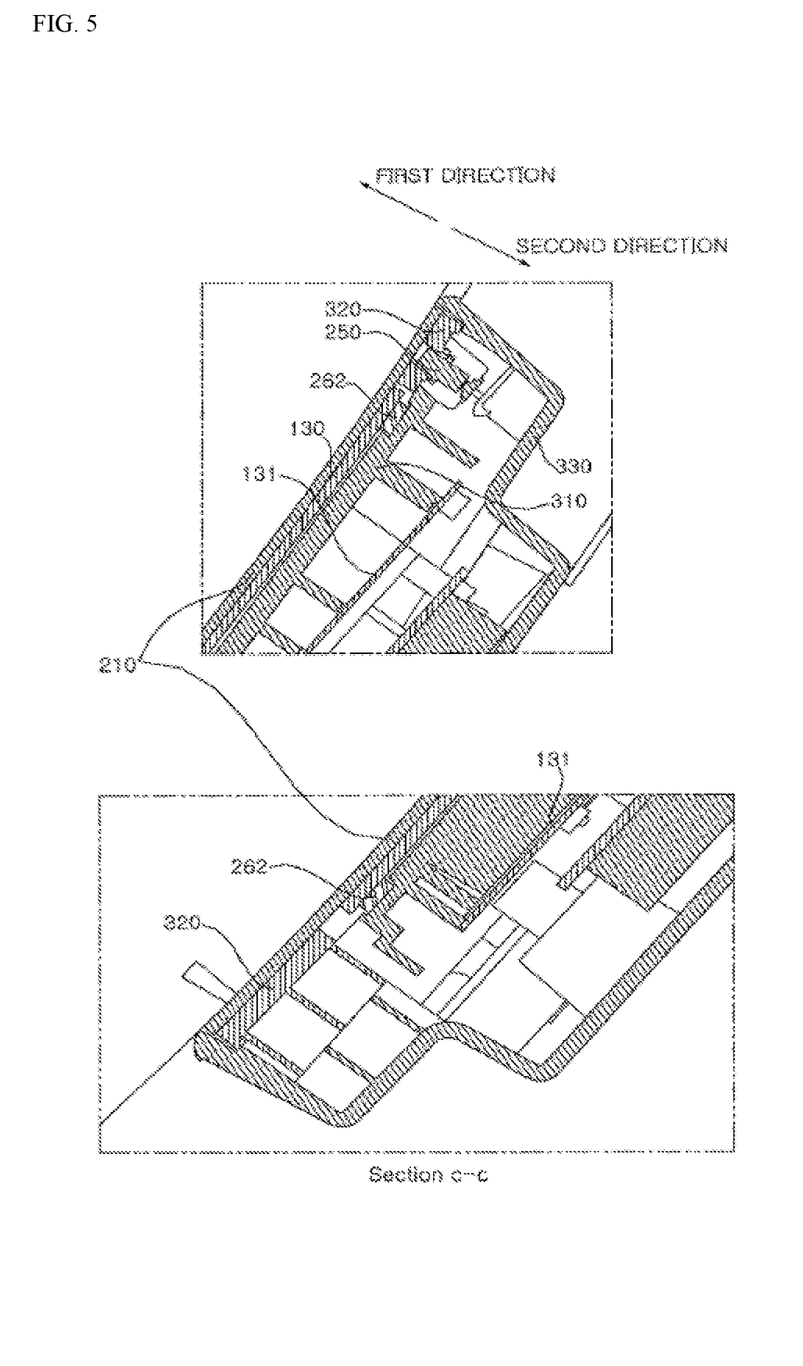
FIG. 5 is a cross-sectional view of FIG. 1A cut along line c-c.

FIG. 5 is a cross-sectional view of FIG. 1A cut along line c-c.

Figure 6:
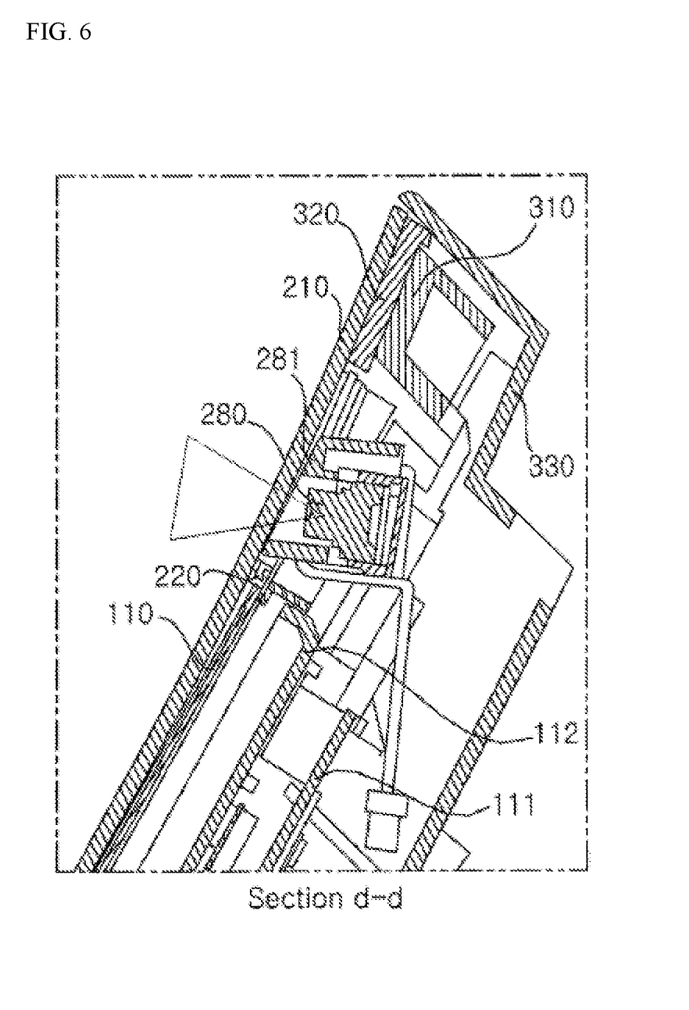
FIG. 6 is a cross-sectional view of FIG. 1A cut along line d-d.

FIG. 6 is a cross-sectional view of FIG. 1A cut along line d-d.

Referring to FIGS. 1A to 6, a vehicle may include an instrument panel 100.

The instrument panel 100 may be provided inside the vehicle.

The instrument panel 100 may extend from the left pillar A to the right pillar A.

Alternatively, when the vehicle's doors are closed, the instrument panel 100 may extend from the inner surface of the left front door of the vehicle to the inner surface of the right front door of the vehicle.

The instrument panel 100 may be bendable.

A cover glass 210, a first frame 310, a second frame 320, and a back cover 330 may be bendable.

In some embodiments, the instrument panel 100 may be bendable in an up-down direction (e.g., the overall height direction of the vehicle). In this case, the instrument panel 100 may have a predetermined curvature in the up-down direction. In this case, the cover glass 210, the first frame 310, the second frame 320, and the back cover 330 may be concavely bendable in the up-down direction with respect to the passenger compartment.

In some embodiments, the instrument panel 100 may be bendable in the left-right direction (e.g., the overall width direction of the vehicle). In this case, the instrument panel 100 may have a predetermined curvature in the left-right direction. In this case, the cover glass 210, the first frame 310, the second frame 320, and the back cover 330 may be concavely bendable in the left-right direction with respect to the passenger compartment.

As such, as the instrument panel 100 is bendable, a user may more easily see and perceive information displayed on the instrument panel 100.

The instrument panel 100 may include a plurality of displays 110, 120, and 130, the cover glass 210, and the first frame 310.

In some embodiments, the instrument panel 100 may further include a wall 220, a haptic actuator 230, an aluminum plate 235 and 236, a glue 240, a second frame 320, an illumination sensor 250, a force sensor 261 and 262, an indicator 270, a camera 280, one or more Printed Circuit Boards (PCBs) 111, 121, and 131, a fan 290, a back cover 330, and one or more brackets 410, 420, and 430 individually or in combination.

The cover glass 210 may be formed of a transparent material.

The cover glass 210 may have a predetermined thickness. It is desirable that the cover glass 210 has a thickness of 2.0 t.

The cover glass 210 may cover a plurality of displays 110, 120, and 130.

The cover glass 210 may include a notch portion 211.

A space for installation of a steering wheel may be secured due to the notch portion 211.

To secure the space for installation of a steering wheel, a notch portion in the same shape of the notch portion 211 in the cover glass 210 may be formed in each of the first frame 310, the second frame 320, and the back cover 330.

The cover glass 210 may be coupled to the first frame 310.

The cover glass 210 may include a coupling structure for being coupled to the first frame 310.

The wall 220 may be disposed between the cover glass 210 and the first display 110. For example, the wall 220 may be disposed between the cover glass 210 and an LCD. Alternatively, the wall 220 may form part of the cover glass 210, preferably the two components being formed together.

When the first display 110 is coupled to the cover glass 210 by using an adhesive material, e.g., Optically Clear Resin (OCR), the wall 220 may prevent a leak of the adhesive material. For example, when an LCD is coupled to the cover glass 210 by ORC, the wall 220 may prevent a leak of resin.

The plurality of displays 110, 120, and 130 may be disposed between the cover glass 210 and the second subframe 320.

The plurality of displays 110, 120, and 130 may be disposed between the cover glass 210 and the first frame 310.

The plurality of displays 110, 120, and 130 may be supported by the first frame 310.

The plurality of displays 110, 120, and 130 may include a first display 110, a second display 120, and a third display 130.

The instrument panel 100 may be divided into multiple regions with respect to occupant seats in the passenger compartment.

The first display 110 may be disposed in a driver seat region.

The driver seat region may be defined as a zone which faces a driver's seat in the instrument panel 100.

The driver's seat is located in the front side of the passenger compartment, and may be defined as a space where a steering wheel and a pedal for manipulating operation of the vehicle are placed.

The second display 120 may be disposed in a center fascia region.

The center fascia region may be defined as a region which faces a space between the driver's seat and the front-passenger seat in the instrument panel 100.

The third display 130 may be in the front-passenger seat.

The front-passenger seat region may be defined as a region which faces the front-passenger seat.

The front-passenger seat is located in the front side of the passenger compartment, and may be defined as a space where a steering wheel and a pedal are not placed.

The plurality of displays 110, 120, and 130 may include one or more Plastic Organic Light-Emitting Diodes (POLEDs) and a Liquid Crystal Display (LCD).

For example, the first display 110 may be implemented as an LCD.

For example, the second display 120 may be implemented as a POLED.

For example, the third displays 130 may be implemented as a POLED

An LCD may be coupled to the cover glass 210 by an adhesive material, such as OCR.

The first display 110 implemented as an LCD may be coupled to the cover glass 210 by, e.g., OCR.

The first display 110 may be formed flat.

An OCR bonding method may be utilized to couple the first display 110, which is flat, to the cover glass 210 which is bent.

The first display 110 may function as a vehicle cluster.

The vehicle cluster may display important information related to travelling of a vehicle, such as a speed, a RPM, and navigation information. It is desirable that the first display 110 is implemented as an LCD because LCDs have better durability and longer life time than OLEDs.

Meanwhile, the first display 110 implemented as an LCD may be provided in a modulated status in the instrument panel 100. In this case, the first display 110 may include a bottom cover 112 (see FIG. 3).

A POLED may be coupled to the cover glass 210 by using an adhesive material, e.g., Optically Clear Adhesive (OCA).

For example, OCA may be a non-liquid OCA. In this case, the POLED may be coupled to the cover glass 210 by using an adhesive sheet.

OCA may be more suitable than OCR for use in flexible curved displays.

The second display 120 and the third display 130 each implemented as a POLED may be coupled to the cover glass 210 by an adhesive material, such as OCA.

The second display 120 and the third display 130 may be bendable.

An OCA bonding method may be used to couple the bendable second and third displays 120 and 130 to the cover glass 210 which is bent.

The second display 120 may serve as a display which controls auxiliary functions of the vehicle and provides entertainment contents.

The second display 120 may be implemented as a touch screen. In this case, the second display 120 may convert a user's touch input into an electrical signal. The electrical signal may be provided to a processor which is mounted on at least one of one or more PCBs 111, 121, and 131.

The third display 130 may serve as a display for Human Machine Interface (HMI) with a person sitting in the front-passenger seat.

The third display 130 may be implemented as a touch screen. In this case, the third display 130 may convert a user's touch input into an electrical signal. The electrical signal may be provided to a processor which is mounted on at least one of one or more PCBs 111, 121, and 131.

The haptic actuator 230 may be disposed between the plurality of displays 110, 120, and 130 and the first frame 310.

There may be a plurality of haptic actuators 230.

The haptic actuator 230 may be disposed between the plurality of displays 110, 120, and 130 and the aluminum plate 235 and 236.

The haptic actuator 230 may be supported by at least one of the plurality of displays 110, 120, and 130 through the aluminum plate 235 and 236.

For example, the haptic actuator 230 may be supported by the second display 120 and the third display 130 through the aluminum plate 235 and 236.

Based on a provided electrical signal, the haptic actuator 230 may provide a haptic effect to at least one of the plurality of displays 110, 120, and 130.

For example, based on an electrical signal provided by a processor which is mounted on at least one of one or more PCBs 111, 121, and 131, the haptic actuator 230 may a haptic effect to the second display 120 or the third display 130.

The aluminum plate 235 and 236 may be disposed between the plurality of displays 110, 120, and 130 and the first frame 310.

The aluminum plate 235 and 236 may help the haptic actuator 230 to be supported by at least one of the plurality of displays 110, 120, and 130.

The aluminum plate 235 and 236 may come into contact with a rear surface of at least one of the plurality of displays 110, 120, and 130.

The aluminum plate 235 and 236 may come into contact with the first frame 310.

The aluminum plate 235 and 236 may transfer heat, which is generated by the POLED displays 120 130 from among the plurality of displays 110, 120, and 130, to the first frame 310, so that the heat can be discharged to the outside.

The aluminum plate 235 and 236 may include a first aluminum plate 235 and a second aluminum plate 236.

A first surface of the first aluminum plate 235 may be attached to a rear surface of the flexible second display 120 with at least one haptic actuator 230 therebetween.

A second surface of the first aluminum plate 235 may come into contact with the first frame 310.

The first aluminum plate 235 may discharge heat, generated by the second display 120, to the outside.

A first surface of the second aluminum plate 236 may be attached to a rear surface of the flexible third display 130 with at least one haptic actuator 230 therebetween.

A second surface of the second aluminum plate 236 may come into contact with the first frame 310.

The second aluminum plate 236 may discharge heat, generated by the third display 130, to the outside.

The glue 240 may be used to attach the cover glass 210 and the second frame 320.

The second frame 320 may be disposed between the cover glass 210 and the first frame 310.

The second frame 320 may be attached to the cover glass 210.

For example, the second frame 320 may be attached to the cover glass 210 by the glue 240.

The second frame 320 may be coupled to the back cover 330 with the first frame 310 therebetween.

The second frame 320 may be formed of a synthetic material of Polycarbonate (PC) and Polyethylene terephthalate (PET).

The second frame 320 may be fastened to the back cover 330.

The second frame 320 may include a coupling structure for being fastened to the back cover 330.

The illumination sensor 250 may detects illumination of the inside of the vehicle.

There may be a plurality of illumination sensors 250.

The plurality of illumination sensors 250 as many as the plurality of displays 110, 120, and 130 may be provided.

Sensing data from the illumination sensor 250 may be provided from a processor which is mounted on at least one of one or more PCBs.

Sensing data from the illumination sensor 250 may be used to adjust brightness of a screen of at least one of the plurality of displays 110, 120, and 130.

The force sensor 261 and 262 may be disposed between the plurality of displays 110, 120, and 130 and the first frame 310.

The force sensor 261 and 262 may detect pressure of a user's touch on one of the plurality of displays 110, 120, and 130.

The force sensor 261 and 262 may include a first force sensor 261 and a second force sensor 262.

The first frame 310 may be disposed between the cover glass 210 and the back cover 330.

The first frame 310 may be pressed and coupled to the cover glass 210 with the plurality of displays 110, 120, and 130 therebetween.

The first frame 310 may include a coupling structure for being pressed and coupled to the cover glass 210.

As the first frame 310 is pressed and coupled to the cover glass 210, it is possible to minimize a gap between components disposed between the first frame 310 and the cover glass 210. Accordingly, it may prevent a crash between the components upon an external shock, and thus, minimize a possibility of damage to the components.

The first frame 310 may support the plurality of displays 110, 120, and 130.

The first frame 310 may be formed of a metal material.

For example, the first frame 310 may be formed of magnesium (Mg).

In the case where the first frame 310 is formed of magnesium (Mg), the first frame 310 may securely and stably support the plurality of displays 110, 120, and 130, and may help make the vehicle compact.

The first frame 310 may include a base, and a plurality of ribs extending from the base.

The plurality of ribs may be formed in regions of the base which correspond to locations of POLEDs.

For example, the plurality of ribs may be formed in regions of the base which correspond to locations of the second display 120 and the third display 130.

The plurality of ribs may extend from the base in a first direction.

For example, the first direction may be a direction in which the cover glass 210 is stacked with respect to the first frame 310. In this case, the plurality of ribs may come into contact with at least one of the plurality of displays 120 and 130. In this case, the plurality of ribs may form a space together with the base and the plurality of displays 120 and 130 which is in contact with the plurality of ribs. The space may be in the shape of a polygonal cylinder.

The plurality of ribs may have a polygonal vertical cross-section in the first direction.

For example, the plurality of ribs may have a hexagonal vertical cross-section in the first direction.

The plurality of ribs may extend from the base in a second direction.

For example, the second direction may be a direction from the first frame 310 to the back cover 330.

For example, the second direction may be a direction opposite to a direction in which the cover glass 210 is stacked with respect to the first frame 310.

The plurality of ribs may have a polygonal vertical cross-section in the second direction.

Due to the plurality of ribs, the first frame 310 may have a wider cross-sectional area, thereby enabled to discharge heat efficiently.

The first frame 310 may include a through-hole in a region corresponding to one of the plurality of displays 110, 120, and 130.

For example, the first frame 310 may include a through-hole in a region corresponding to an LCD.

For example, the first frame 310 may include a through-hole in a region corresponding to the first display 110.

Figure 7A:
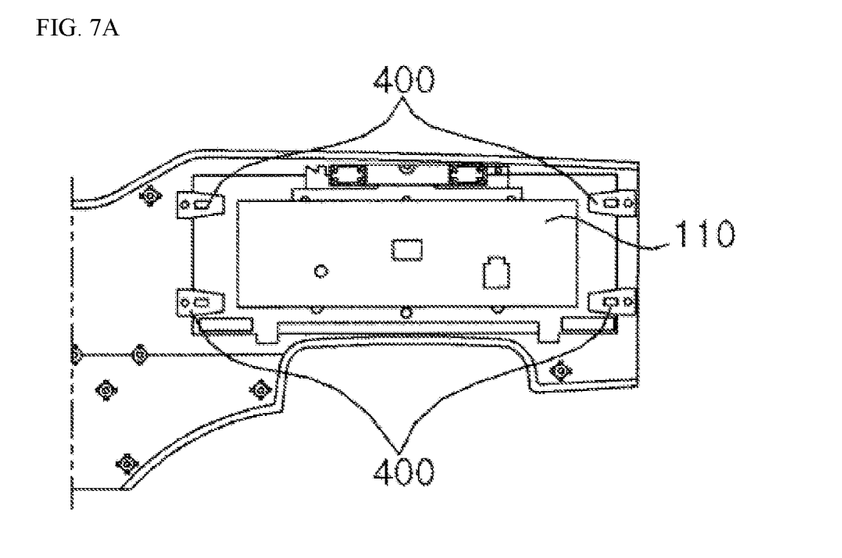
FIGS. 7A to 7C are diagrams illustrating a structure for fixing a first display which is implemented as a Liquid Crystal Display (LCD).
Figure 7B:
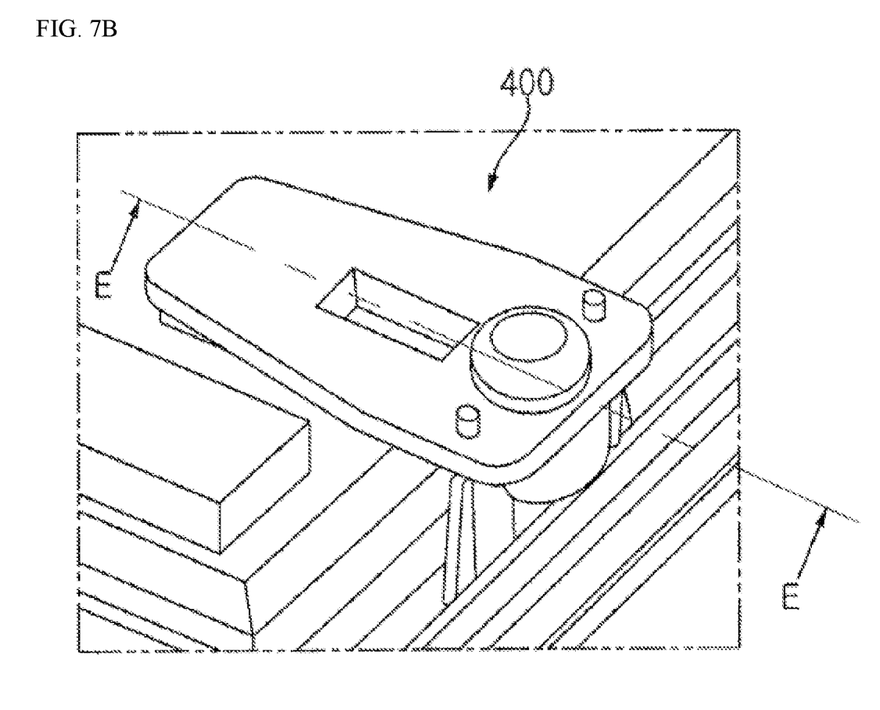
Figure 7C:
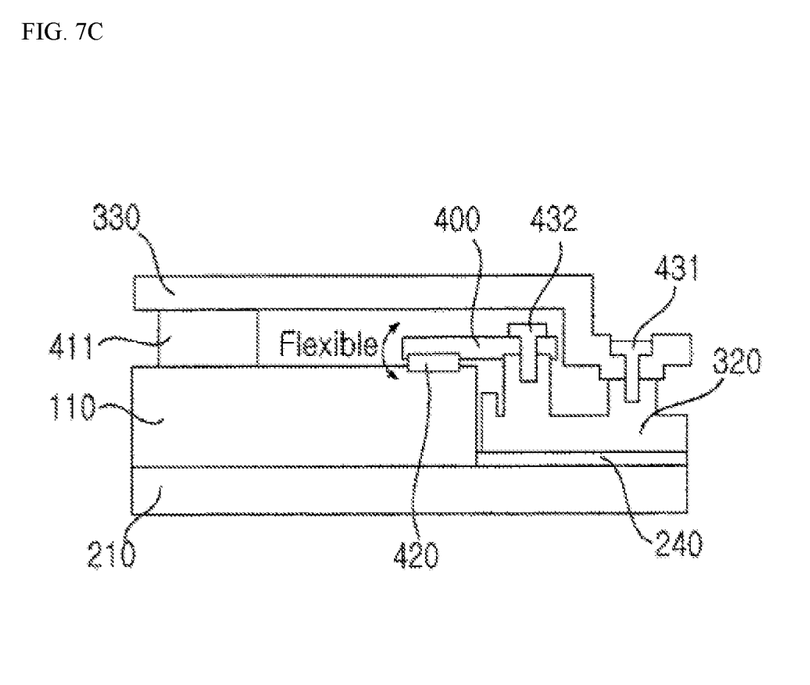

The instrument panel 100 may further include a thermal pad 411 (see FIG. 7C).

The thermal pad 411 may be disposed in a through-hole formed in the first frame 310.

The thermal pad 411 may be disposed between an LCD and the back cover 330.

The thermal pad 411 may come into contact with the back cover 330.

The first frame 310 may be disposed between the plurality of displays 110, 120, and 130 and one or more PCBs 111, 121, and 131.

The indicator 270 may be disposed in the surroundings of the first display 110.

The indicator 270 may output On-Board Diagnostics (OBD) information of the vehicle in the form of an icon.

The instrument panel 100 may further include an indicator PCB 271 (see FIG. 3).

The camera 280 may be disposed in the surroundings of the first display 110.

The camera 280 may capture an image of the inside of the vehicle.

The camera 280 may detect a user's field of view.

One or more PCBs 111, 121, and 131 may be disposed between the first frame 310 and the back cover 330.

One or more processors may be mounted on one or more PCBs 111, 121, and 131.

One or more processors may control the plurality of displays 110, 120, and 130.

One or more processors may control driving of the fan 290.

In some embodiments, one or more processors may control driving of the fan 290 based on a speed of the vehicle.

For example, if a speed of the vehicle is equal to or greater than a preset speed, one or more processors may perform a control action so that the fan 290 is driven.

For example, if a speed of the vehicle is smaller than the preset speed, one or more processors may perform a control action so that the fan 290 stops being driven.

As such, by controlling driving of the fan 290 based on a speed of the vehicle, it is possible to prevent a user from noticing noise caused by driving of the fan 290.

While being spaced apart from the plurality of PCBs 111, 121, and 131 with the first frame 310 therebetween, one or more PCBs 111, 121, and 131 may be electrically connected to the plurality of displays 110, 120, and 130.

One or more PCBs 111, 121, and 131 may be electrically connected to the illumination sensor 250 and the force sensor 261 and 262.

One or more PCBs 111, 121, and 131 may be electrically connected to the fan 290.

The fan 290 may be disposed between the second display 120 and the back cover 330.

The fan 290 may cool down at least one of the plurality of displays 110, 120, and 130.

For example, the fan 290 may cool down the second display 120 or the third display 130.

The back cover 330 may has a space formed therein, the space where the plurality of displays 110, 120, and 130 and the first frame 310 are accommodated.

The back cover 220 may form the space therein by contacting the cover glass 210.

The plurality of displays 110, 120, and 130, and the first frame 310 may be accommodated in the space which is formed by the back cover 330 and the cover glass 210 being in contact with each other.

The back cover 330 may be fastened to the second frame 320.

The back cover 330 may include a coupling structure for being fastened to the second frame 320.

The edge of the back cover 330 may be formed to surround the cover glass 210.

The edge of the back cover 330 may be exposed to the inside of the vehicle.

The edge of the back cover 330 may be plated with chromium.

The back cover 330 may be formed of a synthetic material of Polycarbonate and Acrylonitrile-Butadiene-Styrene (ABS).

A region of the back cover 330 in contact with the thermal pad may be formed of a metal material.

One or more brackets 410, 420, and 430 may be attached to the back cover 330.

One or more brackets 410, 420, and 430 may be connected to a component of the vehicle.

For example, one or more brackets 410, 420, and 430 may be connected to a vehicle frame.

One or more brackets 410, 420, and 430 may have a wave shape having a through-hole formed therein.

One or more brackets 410, 420, and 430 may be formed of an aluminum (Al) material.

Such a shape of the brackets 410, 420, and 430 may help reduce a shock transferred to the instrument panel 100 upon an external shock.

FIGS. 7A to 7C are diagrams illustrating a structure for fixing a first display which is implemented as an LCD.

FIG. 7A illustrates an example of a rear view of a first display, FIG. 7B is a perspective view mainly showing a bracket fixer, and FIG. 7C is a cross-sectional view of FIG. 7B cut along line E-E.

Referring to FIGS. 7A to 7C, the first display 110 may be fixed by a plurality of bracket fixers 400.

The second frame 320 and the back cover 330 may be fastened with one or more screws 431.

The second frame 320 and a bracket fixer 400 may be fastened with a screw 432.

Meanwhile, the instrument panel 100 may further include an elastic member 420.

The elastic member 420 may be disposed between the bracket fixer 400 and the first display 110.

For example, the elastic member 420 may be formed of a rubber material.

For example, when the elastic member 420 in contact with a portion of the bracket fixer 400 is disposed between the bracket fixer 400 and the first display 110, another portion of the bracket fixer 400 may be fastened to the screw 432.

Due to this coupling structure, it is possible to prevent a damage to the first display 110 and to allow the elastic member 420 to absorb an external shock, so that the first display 100 can be protected.

Meanwhile, as described above, the thermal pad 411 may be disposed between the first display 110 and the back cover 330.

The thermal pad 411 may help to discharge heat generated by the first display, and keep the first display 110 in close contact with the back cover 330.

The present invention as described above may be implemented as code that can be written on a computer-readable medium in which a program is recorded and thus read by a computer. The computer-readable medium includes all kinds of recording devices in which data is stored in a computer-readable manner. Examples of the computer-readable recording medium may include a hard disk drive (HDD), a solid state disk (SSD), a silicon disk drive (SDD), a read only memory (ROM), a random access memory (RAM), a compact disk read only memory (CD-ROM), a magnetic tape, a floppy disc, and an optical data storage device. In addition, the computer-readable medium may be implemented as a carrier wave (e.g., data transmission over the Internet). In addition, the computer may include a processor or a controller. Thus, the above detailed description should not be construed as being limited to the embodiments set forth herein in all terms, but should be considered by way of example. The scope of the present invention should be determined by the reasonable interpretation of the accompanying claims and all changes in the equivalent range of the present invention are intended to be included in the scope of the present invention.

What is claimed is:

1. An instrument panel for a vehicle, comprising:
a plurality of displays;
a cover glass that covers the plurality of displays;
a first frame that supports the plurality of displays and is coupled to the cover glass;
a second frame coupled to the cover glass; and
a back cover that is coupled to the second frame and in contact with a least a portion of the cover glass, the back cover defining a space that accommodates the plurality of displays, the first frame, and the second frame therein,
wherein the plurality of displays is interposed between the cover glass and the first frame,
wherein the cover glass, the first frame, the second frame, and the back cover are concavely bendable in a left-right direction with respect to a passenger compartment of the vehicle,
wherein the plurality of displays comprises:
a flat display that has a flat shape, the flat display including (i) a first side that is formed flat and bonded to the cover glass along a curved surface of the cover glass with Optically Clear Resin (OCR) and (ii) a second side that is formed flat and coupled to the first frame, and
a curved display that has a curved shape, the curved display including (i) a first side that is formed curved and coupled to the cover glass along the curved surface of the cover glass by Optically Clear Adhesive (OCA) and (ii) a second side that is formed curved and coupled to the first frame.

2. The instrument panel according to claim 1, wherein the first frame is pressed and coupled to the cover glass to minimize a gap between components disposed between the first frame and the cover glass, and
wherein the flat display is coupled to the first frame and an elastic member to prevent a damage to the flat display and to allow the elastic member to absorb an external shock.

3. The instrument panel according to claim 1, wherein the first frame comprises:
a base; and
a plurality of ribs that extend from the base, each of the plurality of ribs having a polygonal cross-section.

4. The instrument panel according to claim 1, wherein the plurality of displays comprises:
a first display that is a Liquid Crystal Display (LCD) disposed in a driver seat region of the vehicle;
a second display that is a Plastic Organic Light-Emitting Diode (POLED) disposed in a center facia region of the vehicle; and
a third display that is a POLED disposed in a front-passenger seat region of the vehicle.

5. The instrument panel according to claim 1, wherein the second frame is attached to the cover glass, the second frame including a coupling structure that is fastened to the back cover.

6. The instrument panel according to claim 5, further comprising a bracket attached to the back cover, the bracket being coupled to be connected to a component of the vehicle.

7. The instrument panel according to claim 6, wherein the bracket has a wave shape and defines a through-hole therein.

8. The instrument panel according to claim 1, wherein the first frame defines a through-hole at a region corresponding to at least one of the plurality of displays.

9. The instrument panel according to claim 8, further comprising:
a thermal pad disposed in the through-hole and configured to discharge heat from the at least one of the plurality of displays to the back cover.

10. The instrument panel according to claim 1, further comprising a wall disposed between the cover glass and at least one of the plurality of displays, the wall being configured to provide sealing between the cover glass and the at least one of the plurality of displays.

11. The instrument panel according to claim 1, further comprising a fan configured to cool at least one of the plurality of displays.

12. The instrument panel according to claim 1, further comprising one or more printed circuit boards (PCBs) for controlling at least one of the plurality of displays,
wherein the first frame is disposed between the plurality of displays and the one or more PCBs.

13. The instrument panel according claim 1, further comprising an aluminum plate that is in contact with the first frame and a rear surface of at least one of the plurality of displays.

14. The instrument panel according to claim 13, further comprising a haptic actuator configured to provide a haptic feedback to at least one of the plurality of displays,
wherein the haptic actuator is supported by the aluminum plate and is in contact with the at least one of the plurality of displays.

15. The instrument panel according to claim 1, wherein the plurality of displays comprises:
a first display that is disposed at a driver seat region;
a second display that is disposed at a center fascia region; and
a third display that is disposed at a front-passenger seat region.

16. An instrument panel for a vehicle, comprising:
at least one display;
a cover glass that covers the at least one display;
a first frame that supports the at least one display and is coupled to the cover glass, the at least one display being interposed between the cover glass and the first frame;
a second frame coupled to the cover glass; and
a back cover that is coupled to the second frame and in contact with a least a portion of the cover glass, the back cover defining a space that accommodates the at lease one display, the first frame, and the second frame therein,
wherein the at least one display is interposed between the cover glass and the first frame,
wherein the cover glass, the first frame, the second frame, and the back cover are concavely bendable in a left-right direction with respect to a passenger compartment of the vehicle,
wherein the at least one display comprises:
a first display that has a flat shape, the first display including (i) a first side that is formed flat and bonded to the cover glass along a curved surface of the cover glass with Optically Clear Resin (OCR) and (ii) a second side that is formed flat and coupled to the first frame, and
a second display that has a curved shape, the second display including (i) a first side that is formed curved and coupled to the cover glass along the curved surface of the cover glass by Optically Clear Adhesive (OCA) and (ii) a second side that is formed curved and coupled to the first frame.

17. The instrument panel according to claim 16, wherein the first frame is pressed and coupled to the cover glass to minimize a gap between components disposed between the first frame and the cover glass, and
wherein the first display is coupled to the first frame and an elastic member to prevent a damage to the first display and to allow the elastic member to absorb an external shock.

18. The instrument panel according to claim 16, wherein the second frame is attached to the cover glass, the second frame including a coupling structure that is fastened to the back cover.

19. The instrument panel according to claim 16, further comprising a bracket attached to the back cover, the bracket being configured to be connected to a component of the vehicle.

20. The instrument panel according to claim 16, wherein the first frame defines a through-hole at a region corresponding to the at least one display.

21. The instrument panel according to claim 20, further comprising:
a thermal pad disposed in the through-hole and configured to discharge heat from the at least one display to the back cover.

22. The instrument panel according to claim 16, further comprising a wall disposed between the cover glass and the at least one display, the wall being configured to provide sealing between the cover glass and the at least one display.

23. The instrument panel according to claim 16, further comprising a fan configured to cool the at least one display.

24. The instrument panel according to claim 16, further comprising at least one printed circuit board (PCB) for controlling the at least one display,
  wherein the first frame is disposed between the at least one display and the at least one PCB.

25. The instrument panel according to claim 16, further comprising an aluminum plate that is in contact with the first frame and a rear surface of the at least one display.

* * * * *